United States Patent
Suzuki et al.

(10) Patent No.: US 9,775,257 B2
(45) Date of Patent: Sep. 26, 2017

(54) ELECTRONIC DEVICE UNIT AND ELECTRONIC DEVICE

(71) Applicant: Mitsubishi Electric Corporation, Tokyo (JP)

(72) Inventors: Yasuhiro Suzuki, Tokyo (JP); Kenji Kato, Tokyo (JP); Iwao Katsuno, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/036,101

(22) PCT Filed: Jan. 16, 2014

(86) PCT No.: PCT/JP2014/050671
§ 371 (c)(1),
(2) Date: May 12, 2016

(87) PCT Pub. No.: WO2015/107649
PCT Pub. Date: Jul. 23, 2015

(65) Prior Publication Data
US 2016/0295719 A1     Oct. 6, 2016

(51) Int. Cl.
*H05K 7/20* (2006.01)
*H05K 5/02* (2006.01)

(52) U.S. Cl.
CPC ....... *H05K 5/0213* (2013.01); *H05K 7/20009* (2013.01); *H05K 7/20127* (2013.01)

(58) Field of Classification Search
None
See application file for complete search history.

(56) References Cited

U.S. PATENT DOCUMENTS

| | | | | |
|---|---|---|---|---|
| 5,959,836 A | * | 9/1999 | Bhatia | G06F 1/203 361/679.41 |
| 6,259,601 B1 | * | 7/2001 | Jaggers | G06F 1/203 165/104.33 |

(Continued)

FOREIGN PATENT DOCUMENTS

| | | |
|---|---|---|
| DE | 102009039507 A1 | 3/2011 |
| DE | 102014201483 A1 | 7/2015 |

(Continued)

OTHER PUBLICATIONS

Communication dated May 20, 2016, from the Intellectual Property Office of Taiwan in counterpart application No. 103112969.

(Continued)

*Primary Examiner* — Courtney Smith
(74) *Attorney, Agent, or Firm* — Sughrue Mion, PLLC; Richard C. Turner

(57) ABSTRACT

The present invention is an electronic device unit including an electronic device that has air inlets formed on a bottom surface of a main housing body having electronic components housed therein, and that introduces air to an inner part of the main housing body through the air inlets to cool the inner part of the main housing body, and a battery pack that is attached to the main housing body in a state where a battery case covers a part of a portion being an extensional region of the air inlets, wherein a surrounding wall part is provided on the bottom surface of the main housing body to surround a ventilation region in which the air inlets are provided and to be open at a portion facing the ventilation region, and the battery case is attached to the main housing body via protruding ends of the surrounding wall part.

4 Claims, 8 Drawing Sheets

(56) References Cited

U.S. PATENT DOCUMENTS

| | | | |
|---|---|---|---|
| 6,322,175 B1 | 11/2001 | Aggus et al. | |
| 6,353,536 B1* | 3/2002 | Nakamura | G06F 1/20 361/679.41 |
| 6,459,577 B1 | 10/2002 | Holmes et al. | |
| 6,822,856 B2* | 11/2004 | Fujiwara | G06F 1/203 165/185 |
| 6,837,057 B2* | 1/2005 | Pokharna | G06F 1/203 361/679.41 |
| 7,301,767 B2* | 11/2007 | Takenoshita | G06F 1/203 165/80.3 |
| 8,000,099 B2* | 8/2011 | Parker | G06F 1/1632 174/16.1 |
| 8,422,232 B2* | 4/2013 | Kwak | H01Q 1/02 343/872 |
| 8,681,501 B2* | 3/2014 | Govindasamy | G06F 1/203 174/16.3 |
| 9,226,427 B2* | 12/2015 | Liu | H05K 7/20145 |
| 2004/0080909 A1* | 4/2004 | Kitahara | G06F 1/1632 361/679.48 |
| 2007/0091560 A1 | 4/2007 | Parker | |
| 2015/0124398 A1* | 5/2015 | Kirkpatrick | H05K 7/20136 361/679.48 |
| 2015/0216075 A1 | 7/2015 | Henkel | |

FOREIGN PATENT DOCUMENTS

| | | |
|---|---|---|
| JP | 09-232780 A | 9/1997 |
| JP | 2001-144475 A | 5/2001 |
| JP | 2004-014638 A | 1/2004 |
| JP | 2007-122709 A | 5/2007 |
| JP | 2010-219395 A | 9/2010 |
| JP | 2012-059857 A | 3/2012 |
| JP | 2013-004616 A | 1/2013 |
| KR | 10-2011-0139501 A | 12/2011 |
| TW | M324187 U | 12/2007 |
| TW | 200920243 A | 5/2009 |

OTHER PUBLICATIONS

Japanese Notice of Rejection issued in JP 2014-540239 dated Nov. 11, 2014.

Japanese Decision of a Patent Grant issued in JP 2014-540239 dated Feb. 3, 2015.

International Search Report of PCT/JP2014/050671 dated Mar. 18, 2014.

Communication dated Aug. 19, 2016, from the Korean Intellectual Property Office in counterpart Korean application No. 10-2016-7016125.

Communication dated Mar. 17, 2017, issued by the German Patent Office in corresponding German Application No. 112014005751.7.

* cited by examiner

ELECTRONIC DEVICE UNIT AND ELECTRONIC DEVICE

CROSS REFERENCE TO RELATED APPLICATIONS

This is a National Stage of International Application No. PCT/JP2014/050671 filed Jan. 16, 2014, the contents of which are incorporated herein by reference in its entirety.

FIELD

The present invention relates to an electronic device unit and an electronic device.

BACKGROUND

In recent electronic devices, resin is commonly used as a material of a main housing body. Although less expensive than metal, resin used as a material of a main housing body is lower in thermal conductivity than metal. Therefore, in many electronic devices, vent holes are formed on an outer surface of the main housing body and ventilation is performed between an inner part and an outer part of the main housing body through the vent holes to cool the inner part of the main housing body (see, for example, Patent Literatures 1 and 2).

CITATION LIST

Patent Literatures

Patent Literature 1: Japanese Patent Application Laid-open No. 2004-14638
Patent Literature 2: Japanese Patent Application Laid-open No. H9-232780

SUMMARY

Technical Problem

In an electronic device described in Patent Literatures 1 and 2, vent holes are formed on a main housing body to be open at the sides. Accordingly, when the electronic device is placed in a state where a space is ensured at the sides of the main housing body, a sufficient amount of ventilation air is provided through the vent holes. However, for example, when peripheral devices are installed around the electronic device to cover a part of an extensional region of the vent holes to constitute an electronic device unit, ventilation through the vent holes is restricted, which may lead to a high-temperature state of an inner part of the main housing body due to heat generation of electronic components.

The present invention has been achieved in view of the above circumstances, and an object of the present invention is to provide an electronic device unit that can always ensure a cooling performance to a main housing body without being affected by peripheral devices installed around thereof.

Solution to Problem

To achieve the above described object, an electronic device unit according to the present invention includes: an electronic device that has vent holes formed on an outer surface of a main housing body having electronic components housed therein, and that performs ventilation between an inner part and an outer part of the main housing body through the vent, holes to cool the inner part of the main housing body; and a peripheral device that is attached to the main housing body in a state where a peripheral device housing covers a part of a portion being an extensional region of the vent holes. A surrounding wall part is provided on the outer surface of the main housing body to surround a ventilation region in which the vent holes are provided and to be open at a portion facing the ventilation region, and the peripheral device housing is attached to the main housing body via protruding ends of the surrounding wall part.

Advantageous Effects of Invention

According to the present invention, ventilation through vent holes of a main housing body is ensured by a surrounding wall part provided on an outer surface of the main housing body without being affected by peripheral devices installed around thereof, and the main housing body can always be cooled sufficiently.

DESCRIPTION OF EMBODIMENTS

Preferred embodiments of an electronic device unit and an electronic device according to the present invention will be explained below in detail with reference to the accompanying drawings. The present invention is not limited to the embodiments.

First Embodiment

FIGS. 1 to 5 illustrate an electronic device unit according to a first embodiment of the present invention. The electronic device unit illustrated as an example is configured to include an electronic device 10 that has a substrate 1 housed in a main housing body 11, and a battery pack 20 being a peripheral device for the electronic device 10.

Figure 5:
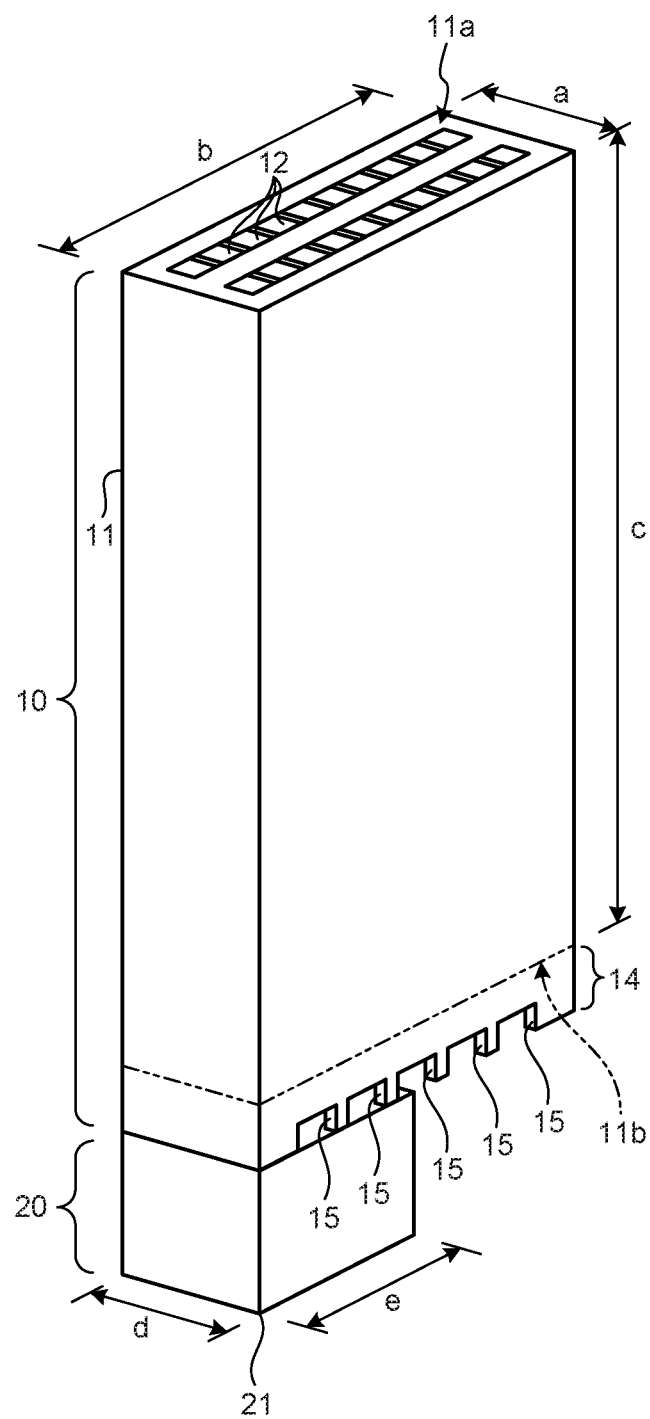
FIG. 5 is a perspective view of an appearance of the electronic device unit illustrated in FIG. 1.

The main housing body 11 of the electronic device 10 is formed of resin in a cuboid shape. The main housing body 11 illustrated as an example in the first embodiment houses therein the substrate 1 being a rectangular plate shape with a posture such that a mounting surface for electronic components is vertically placed. As illustrated in FIG. 5, the main housing body 11 has such dimensions that a width b in a horizontal direction is about four times as large as a depth a in a front-back direction and a height c in a vertical direction is about twice as large as the width b in the horizontal direction. Although not clearly illustrated in the drawings, an electronic circuit constituted of elements including a wide-bandgap semiconductor such as a SiC (silicon carbide) semiconductor is formed on the substrate 1 housed in the main housing body 11.

Figure 4:
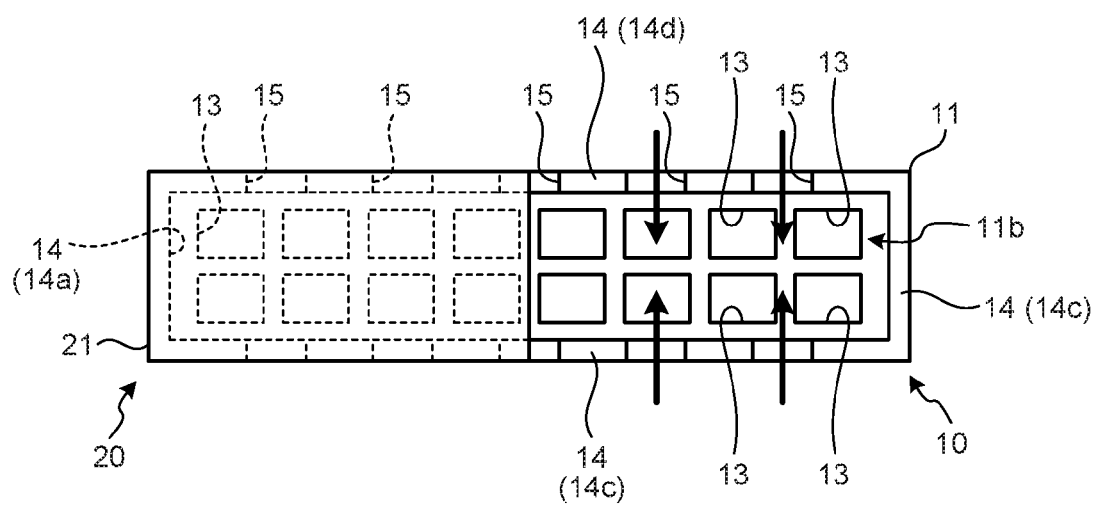
FIG. 4 is a bottom view of the electronic device unit illustrated in FIG. 1.

The main housing body 11 has a plurality of air outlets 12 formed on a top surface 11a and has a plurality of air inlets (vent holes) 13 formed on a bottom surface 11b as illustrated in FIGS. 4 and 5. The air outlets 12 and the air inlets 13 are through holes that cause an inner part and an outer part of the main housing body 11 to communicate with each other. In the first embodiment, the air outlets 12 having the same size from each other in a rectangular shape are formed in two rows one behind the other along the horizontal direction on the top surface 11a of the main housing body 11 while the air inlets 13 having the same size from each other in a rectangular shape are formed in two rows one behind the other along the horizontal direction on the bottom surface 11b of the main housing body 11. The air outlets 12 formed on the top surface 11a of the main housing body 11 are formed to have a smaller opening area than the air inlets 13 formed on the bottom surface 11b of the main housing body 11 to prevent entry of foreign matters from outside and to prevent influences of electrostatic discharge.

The battery pack 20 has a battery (not illustrated) housed in a battery case (peripheral device housing) 21. The battery case 21 applied in the first embodiment has a cuboid shape having a depth d in the front-back direction substantially equal to the depth a of the main housing body 11 and a width e in the horizontal direction substantially half the width b of the main housing body 11 as illustrated in FIG. 5 and is molded of the same resin as the main housing body 11, for example. The battery pack 20 is attached to the main housing body 11 in a state of facing the bottom surface 11b to constitute an electronic device unit.

If the battery pack 20 is attached directly to the bottom surface 11b of the main housing body 11, ventilation through the air inlets 13 on the bottom surface 11b is blocked. For this reason, in the electronic device unit according to the first embodiment, a surrounding wall part 14 is provided on the bottom surface 11b of the main housing body 11. The surrounding wall part 14 is configured by integrally providing thin-plate wall elements 14a, 14b, 14c, and 14d at edge portions of the bottom surface 11b along the side surfaces of the main housing body 11, respectively, to form a rectangular duct. While surrounding a region (ventilation region) including all the air inlets 13 formed on the bottom surface 11b of the main housing body 11, the surrounding wall part 14 is open at a portion facing the region including all the air inlets 13.

A plurality of ventilating notches 15 are provided on each of the front and back wall elements 14c and 14d in the longitudinal direction of the surrounding wall part 14. The ventilating notches 15 are rectangular openings formed from protruding ends of the wall elements 14c and 14d. In the first embodiment, the ventilating notches 15 are formed to have a height substantially half the height of each of the wall elements 14c and 14d at five positions equally spaced from each other.

Figure 1:
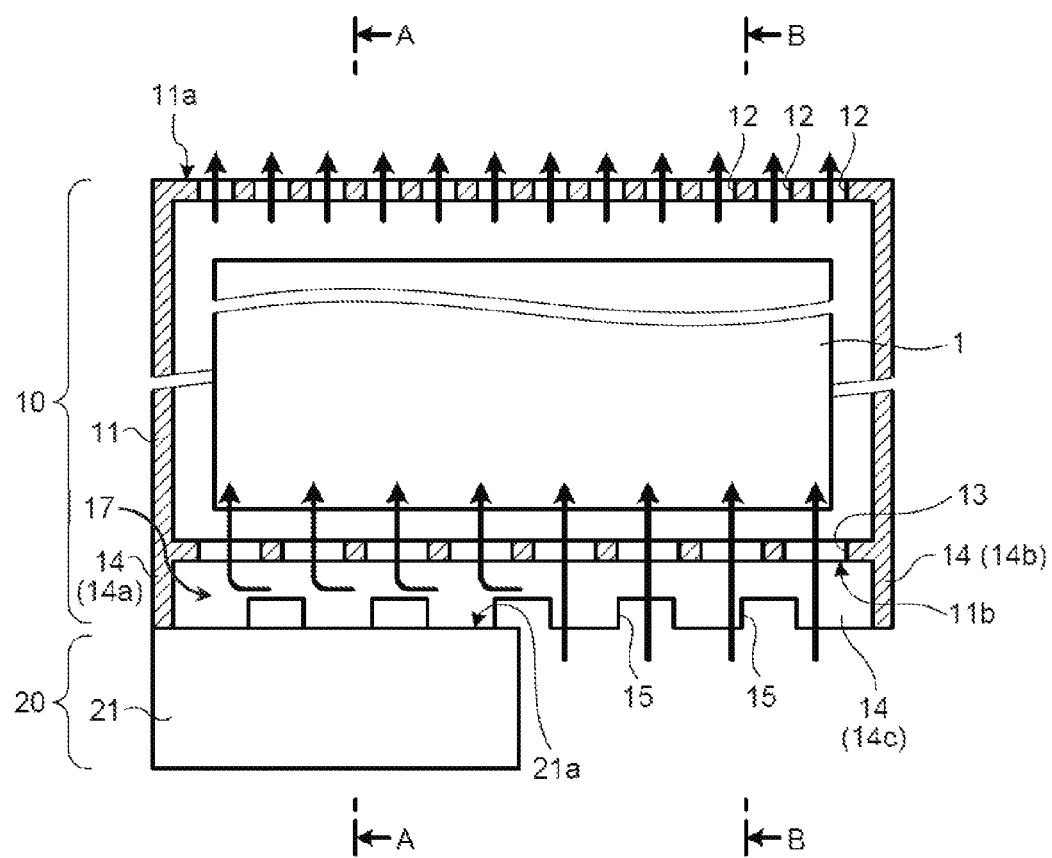
FIG. 1 is a sectional view of principal parts of an electronic device unit according to a first embodiment of the present invention.
Figure 2:
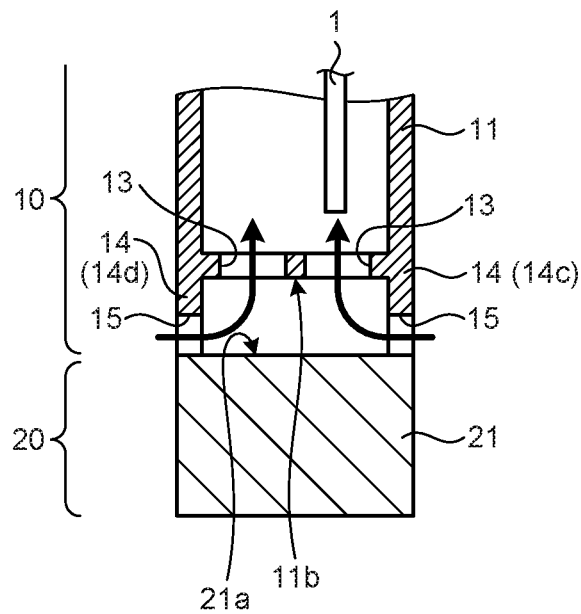
FIG. 2 is a sectional view of the electronic device unit illustrated in FIG. 1 taken along a line A-A.
Figure 3:
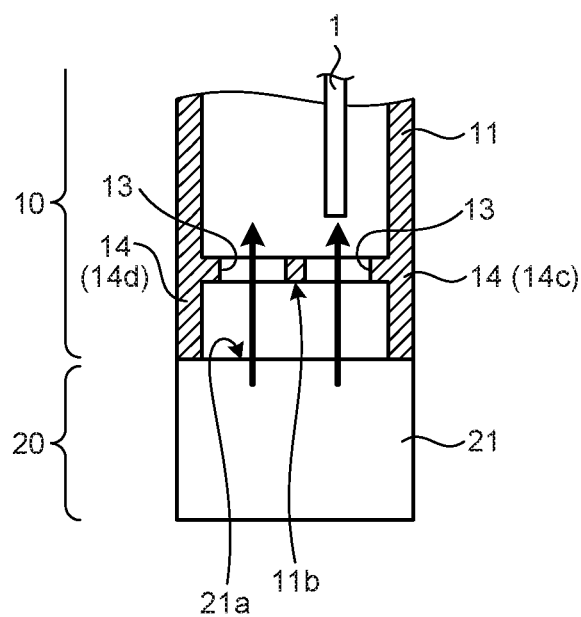
FIG. 3 is a sectional view of the electronic device unit illustrated in FIG. 1 taken along a line B-B.

In the electronic device unit configured as described above, when the battery pack 20 is attached in a state where a top surface 21a of the battery case 21 faces the bottom surface 11b of the main housing body 11, the protruding ends of the surrounding wall part 14 abut on the top surface 21a of the battery case 21 as illustrated in FIGS. 1 to 3. Accordingly, a ventilating space is secured by the surrounding wall part 14 between the bottom surface 11b of the main housing body 11 and the top surface 21a of the battery case 21, which makes it possible to ventilate between the inner part and the outer part of the main housing body 11 through all the air inlets 13 provided on the bottom surface 11b of the main housing body 11.

Furthermore, because the battery case 21 having the width e substantially half the width b in the horizontal direction of the main housing body 11 is attached in the electronic device unit according to the first embodiment, substantially half the bottom surface 11b of the main housing body 11 is always kept open downward even when an object is placed around thereof in any state.

As a result, when an internal temperature of the main housing body 11 increases due to heat generation of the electronic components, inside air having the increased temperature is released to outside of the main housing body 11 through the air outlets 12 on the top surface 11a by convection and outside air is introduced to the inner part of the main housing body 11 through all the air inlets 13 formed on the bottom surface 11b. Therefore, the inner part of the main housing body 11 is efficiently cooled by the outside air and there is no risk of the inner part of the main housing body 11 from becoming a high-temperature state due to heat generation of the electronic components. This enables the inner part of the main housing body 11 to be sufficiently cooled even when an electronic circuit is constituted of elements including a wide-bandgap semiconductor having a small heat generation amount to downscale the main housing body 11.

The surrounding wall part 14 of the main housing body 11 is provided along the side surfaces of the main housing body 11 and can be molded at the same time as when the main housing body 11 is molded of resin. Furthermore, the ventilating notches 15 of the surrounding wall part 14 have a shape open to the protruding ends of the surrounding wall part 14. Therefore, a mold release direction in a case where the main housing body 11 is molded of resin does not become complicated and the manufacturing operation of the main housing body 11 does not become cumbersome.

In the first embodiment described above, because the ventilating notches 15 are provided on the surrounding wall part 14, ventilation from an outer part to an inner part of the surrounding wall part 14 is ensured through the ventilating notches 15 even in a state where an extensional region of the air inlets 13 is completely covered. Therefore, even when the bottom surface 11b of the electronic device 10 without the battery pack 20 attached thereto is installed in a state of facing a mount face, the inner part of the main housing body 11 can be cooled by the outside air, which enables the electronic device 10 to be used alone. Furthermore, a plurality of the ventilating notches 15 are provided on each of the front and back wall elements 14c and 14d in the longitudinal direction. Accordingly, even when an object such as a peripheral device is installed to be close to one of the wall elements 14c and 14d, for example, the wall element 14c of the main housing body 11, the ventilating notches 15 provided on the other wall element 14d are kept in an open state and therefore there is no risk that the cooling performance of the main housing body 11 is degraded.

Figure 6:
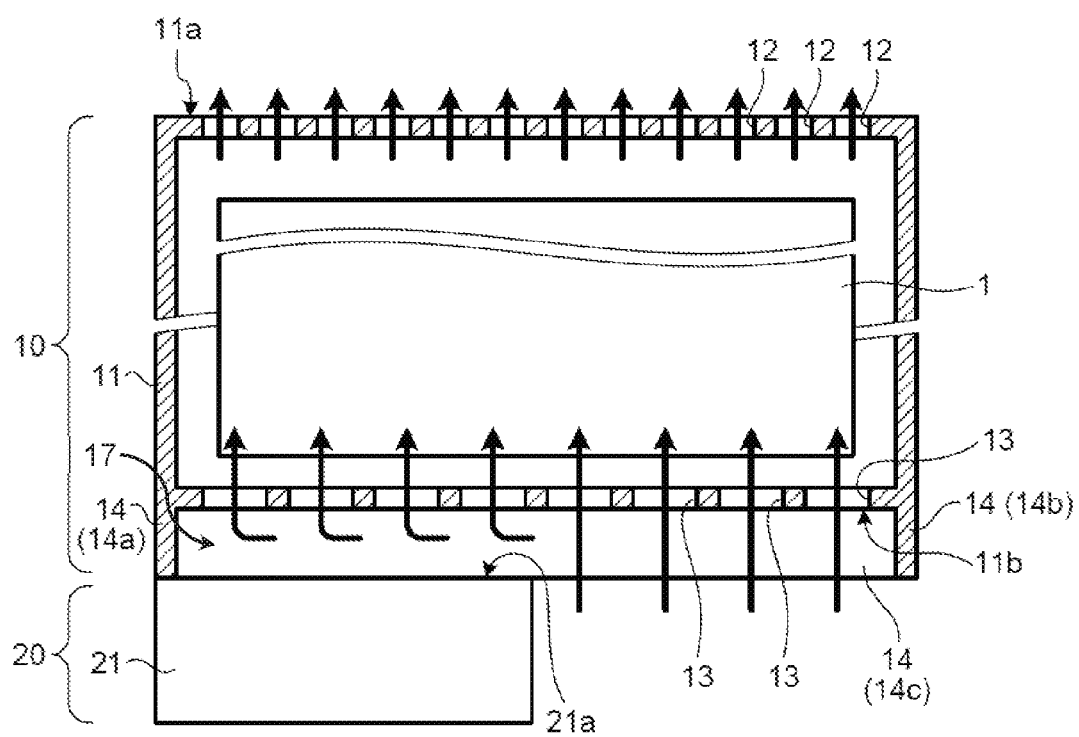
FIG. 6 is a sectional view of principal parts illustrating a modification of the first embodiment illustrated in FIG. 1.
Figure 7:
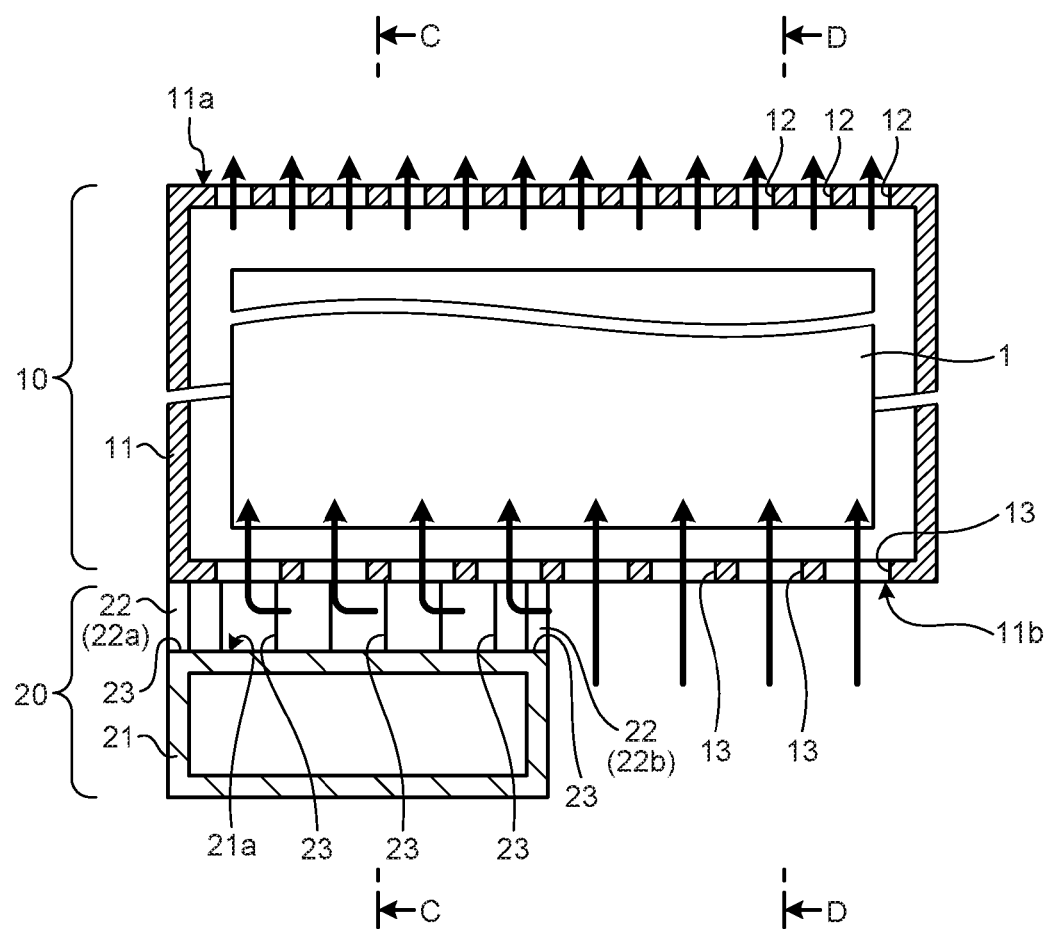
FIG. 7 is a sectional view of principal parts of an electronic device unit according to a second embodiment of the present invention.
Figure 8:
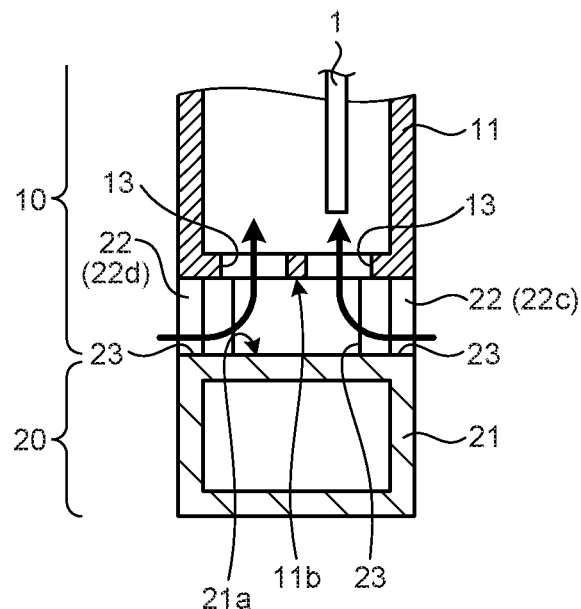
FIG. 8 is a sectional view of the electronic device unit illustrated in FIG. 7 taken along a line C-C.
Figure 9:
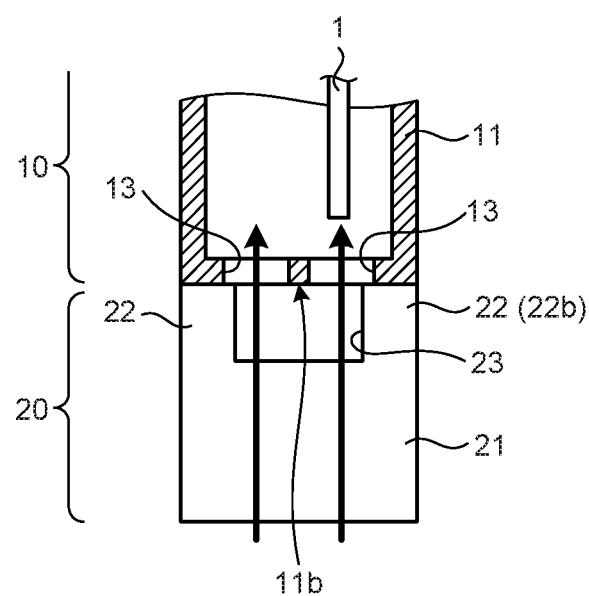
FIG. 9 is a sectional view of the electronic device unit illustrated in FIG. 7 taken along a line D-D.
Figure 10:
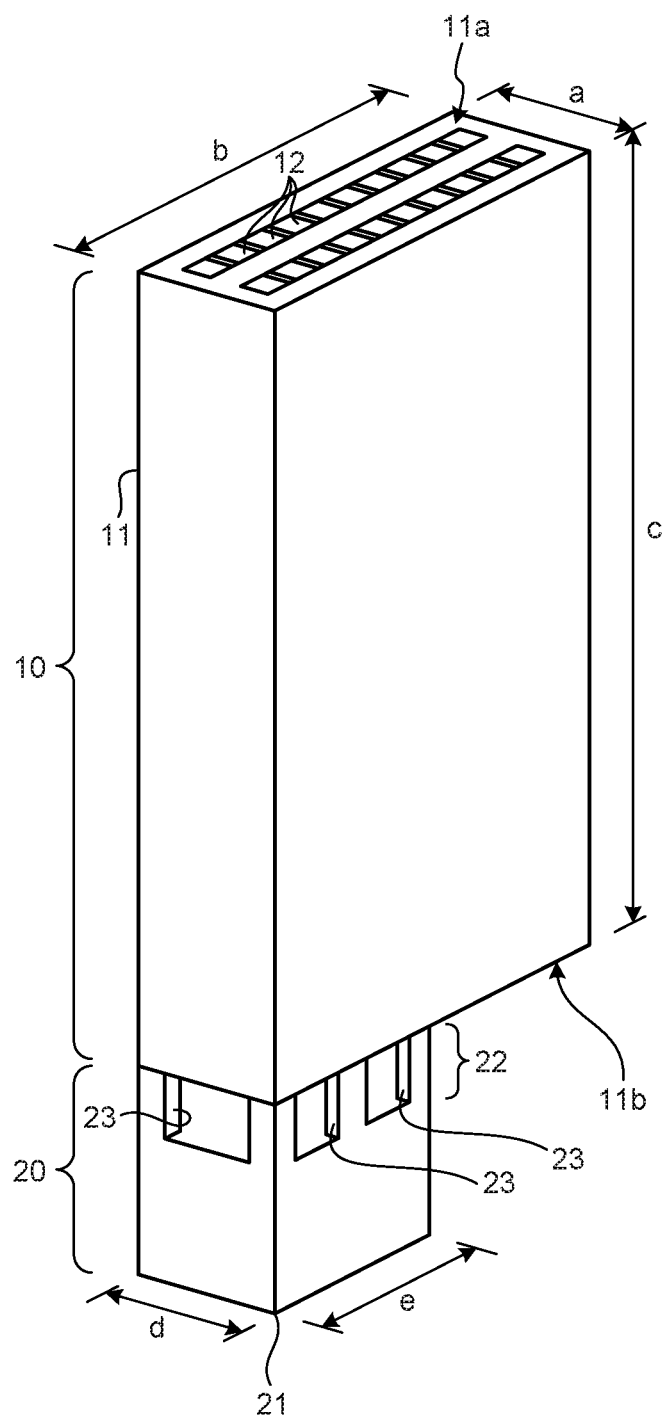
FIG. 10 is a perspective view of an appearance of the electronic device unit illustrated in FIG. 7.

However, when the battery pack 20 is attached to the main housing body 11 in a state of covering a part of a portion being an extensional region 17 of the air inlets 13 as in the first embodiment, the remaining part of the bottom surface 11b of the main housing body 11 is kept open and thus the inner part of the main housing body 11 can be cooled without provision of the ventilating notches 15 on the surrounding wall part 14 as in a modification illustrated in FIG. 6. In the modification illustrated in FIG. 6, constituent elements identical to those in the first embodiment are denoted by like reference signs and detailed descriptions thereof will be omitted.

Second Embodiment

FIGS. 7 to 10 illustrate an electronic device unit according to a second embodiment of the present invention. The electronic device unit illustrated as an example is configured to include the electronic device 10 having the substrate 1 housed in the main housing body 11 and the battery pack 20 being a peripheral device for the electronic device 10 similarly to the first embodiment, and is different from that according to the first embodiment in the target on which a surrounding wall part is provided. That is, while the surrounding wall part 14 is provided on the main housing body 11 in the first embodiment, a surrounding wall part 22 is provided on the top surface 21a of the battery case 21 in the electronic device unit according to the second embodiment. In the following descriptions, constituent elements identical to those in the first embodiment are denoted by like reference signs and detailed descriptions thereof will be omitted.

The surrounding wall part 22 is configured by integrally providing thin-plate wall elements 22a, 22b, 22c, and 22d at edge portions of the top surface 21a along the side surfaces of the battery case 21, respectively, to form a rectangular duct.

Ventilating notches 23 are provided on the four wall elements 22a, 22b, 22c, and 22d of the surrounding wall part 22. The ventilating notches 23 are rectangular openings formed from protruding ends of the wall elements 22a, 22b, 22c, and 22d. In the second embodiment, two ventilating notches 23 are provided on each of the front and back wall elements 22c and 22d in the longitudinal direction and one ventilating notch 23 is provided on each of the right and left wall elements 22a and 22b in the lateral direction. In the second embodiment, the ventilating notches 23 are formed to have substantially the same height as that of the wall elements 22a, 22b, 22c, and 22d.

In the electronic device unit configured as described above, when the battery pack 20 is attached in a state where the top surface 21a of the battery case 21 faces the bottom surface 11b of the main housing body 11, protruding ends of the surrounding wall part 22 abut on the bottom surface 11b of the main housing body 11. Accordingly, a ventilating space is secured by the surrounding wall part 22 between the bottom surface 11b of the main housing body 11 and the top surface 21a of the battery case 21, which makes it possible to ventilate between the inner part and the outer part of the main housing body 11 through all the air inlets (vent holes) 13 provided on the bottom surface 11b of the main housing body 11.

Furthermore, in the electronic device unit according to the second embodiment, the battery case 21 having the width substantially half the width b in the horizontal direction of the main housing body 11 is attached. Therefore, when an object is placed around thereof in any state, substantially half the bottom surface 11b of the main housing body 11 is always kept open downward.

As a result, when an internal temperature of the main housing body 11 increases due to heat generation of the electronic components, inside air having the increased temperature is released to outside of the main housing body 11 through the air outlets 12 provided on the top surface 11a by convection; and outside air is introduced to the inner part of the main housing body 11 through all the air inlets 13 formed on the bottom surface 11b. Therefore, the inner part of the main housing body 11 is cooled by the outside air and there is no risk of the inner part of the main housing body 11 from becoming a high-temperature state due to heat generation of the electronic components. This enables the inner part of the main housing body 11 to be sufficiently cooled even when an electronic circuit is constituted of elements including a wide-bandgap semiconductor having a small heat generation amount to downscale the main housing body 11.

Furthermore, the surrounding wall part 22 of the battery case 21 is provided along the side surfaces of the battery case 21 and can be molded at the same time as when the battery case 21 is molded of resin. Furthermore, the ventilating notches 23 of the surrounding wall part. 22 have a shape open to the protruding ends of the surrounding wall part 22. Therefore, a mold release direction in a case where the battery case 21 is molded of resin does not become complicated and the manufacturing operation of the battery case 21 does not become cumbersome.

In the first and second embodiments described above, air is introduced through the air inlets 13 provided on the bottom surface 11b of the main housing body 11 and air is released through the air outlets 12 provided on the top surface 11a of the main housing body 11. However, the present invention is not limited thereto. For example, vent holes may be formed on the top and side surfaces of a main housing body and air introduced through the vent holes on the side surfaces may be released from the vent holes on the top surface. Alternatively, vent holes may be formed on two side surfaces of a main housing body and air introduced through the vent holes on one of the side surfaces may be released from the vent holes formed on the other side surface.

Furthermore, in the first and second embodiments described above, to the main housing body 11 that has such dimensions that the width b in the horizontal direction is about four times as large as the depth a in toe front-back direction and the height c in the vertical direction is about twice as large as the width b in the horizontal direction, the battery case 21 that has the width e about half the width b is attached. However, the dimensions of the main housing body and the battery case are not limited thereto. Further, the peripheral device is not limited to a battery pack. In addition, the positions and the number of the ventilating notches 15 or 23 formed on the surrounding wall part 14 or 22 are not limited to the examples described above.

INDUSTRIAL APPLICABILITY

As described above, the present invention is useful as a cooling structure for an electronic device having housed therein electronic components that generate heat.

REFERENCE SIGNS LIST 1 substrate, 10 electronic device, 11 main housing body, 11b bottom surface, 13 air inlet, 14, 22 surrounding wall part, 14a, 14b, 14c, 14d, 22a, 22b, 22c, 22d wall element, 15, 23 ventilating notch, 20 battery pack, 21 battery case, 21a top surface.

The invention claimed is:

1. An electronic device unit comprising:
   an electronic device that has vent holes formed on an outer surface of a main housing body having electronic components housed therein, and that performs ventilation between an inner part and an outer part of the main housing body through the vent holes to cool the inner part of the main housing body; and
   a peripheral device that is attached to the main housing body in a state where a peripheral device housing covers a part of a portion being an extensional region of the vent holes, wherein
   a surrounding wall part is provided on the outer surface of the main housing body,
   the surrounding wall part surrounds a ventilation region in which the vent holes are provided with an opening portion that faces the ventilation region to keep a space between the ventilation region and a part of the peripheral device, and the peripheral device housing is attached to the main housing body via protruding ends of the surrounding wall part so as to maintain the space, and
   ventilating notches are formed on the surrounding wall part.

2. An electronic device unit comprising:
   an electronic device that has vent holes formed on an outer surface of a main housing body having electronic components housed therein, and that performs ventilation between an inner part and an outer part of the main housing body through the vent holes to cool the inner part of the main housing body; and
   a peripheral device that is attached to the main housing body in a state where a peripheral device housing covers a part of a portion being an extensional region of the vent holes, wherein
   a surrounding wall part is provided on an outer surface of the peripheral device housing, ventilating notches are formed on the surrounding wall part, and the peripheral device housing is attached to the main housing body via protruding ends of the surrounding wall part in a state where the surrounding wall part surrounds the vent holes provided on the main housing body.

3. The electronic device unit according to claim 1, wherein a substrate, on which a wide-bandgap semiconductor element is mounted, is placed in the main housing body.

4. The electronic device unit according to claim 2, wherein a substrate, on which a wide-bandgap semiconductor element is mounted, is placed in the main housing body.

* * * * *